United States Patent [19]

Katoh

[11] Patent Number: 5,010,019
[45] Date of Patent: Apr. 23, 1991

[54] METHOD OF MAKING A SEMICONDUCTOR DEVICE OPERATING IN HIGH FREQUENCY RANGE

[75] Inventor: Takayuki Katoh, Hyogo, Japan

[73] Assignee: Mitsubishi Denki Kabushiki Kaisha, Tokyo, Japan

[21] Appl. No.: 513,642

[22] Filed: Apr. 24, 1990

Related U.S. Application Data

[62] Division of Ser. No. 426,926, Oct. 26, 1989, which is a division of Ser. No. 81,709, Aug. 3, 1987, Pat. No. 4,926,234.

[30] Foreign Application Priority Data

Aug. 6, 1986 [JP] Japan .................. 61-185715

[51] Int. Cl.⁵ ............... H01L 21/60; H01L 21/66
[52] U.S. Cl. ........................................ 437/8; 437/51; 437/180; 437/209
[58] Field of Search ............... 437/8, 48, 51, 180, 437/209, 183; 148/DIG. 162

[56] References Cited

U.S. PATENT DOCUMENTS

| | | | |
|---|---|---|---|
| 3,691,628 | 9/1972 | Kim et al. | 437/209 |
| 3,805,375 | 4/1973 | LaCombe et al. | 437/183 |
| 4,283,733 | 8/1981 | Aomura | 357/68 |
| 4,566,184 | 1/1986 | Higgins et al. | 437/8 |
| 4,684,973 | 8/1987 | Takano et al. | 357/68 |

FOREIGN PATENT DOCUMENTS

| | | |
|---|---|---|
| 0128986 | 12/1982 | European Pat. Off. |
| 0166633 | 1/1986 | European Pat. Off. |
| 5698875 | 1/1980 | Japan |
| 6294965 | 10/1987 | Japan |

OTHER PUBLICATIONS

*Microwave System News*, "Precise MMIC Parameters Yielded by 18 GHz Water Probe," by K. R. Greason et al., May, 1983, pp. 55-65.

*Microwave System News*, "Microwaver Wafer Probing Achieves On-Water Measurements Through 18 GHz" by. D. E. Lariton et al., May 1985, pp. 99-115.

"Design Considerations for Monolithic Microwave Circuits" by Pucel, R. A., 8099 IEEE Trans. on Microwave Theory & Techniques, vol. MTT-29 (1981), Jun. N 6, New York, USA.

*Primary Examiner*—Brain E. Hearn
*Assistant Examiner*—Chandra Chaudhari
*Attorney, Agent, or Firm*—Lowe, Price, LeBlanc, Becker & Shur

[57] ABSTRACT

A semiconductor device operating in a high frequency range is formed in structure capable of facilitating and highly accurate frequency characteristic test. A semiconductor substrate (1) is provided on a major surface with an input electrode pad (2a) and an output electrode pad (2b) to be connected with integrated circuits included in the semiconductor substrate (1) respectively, while grounding electrode pads (2c) are formed each with paired grounding lines disposed on both sides of the input and output electrode pads (2a, 2b), respectively, to sandwich the same. The grounding electrode pads (2c) ground the semiconductor substrate (1) in a high frequency characteristic test. The input electrode pad (2a) and the grounding lines of the grounding electrode pads (2c) on both sides thereof as well as the output electrode pad (2b) and the corresponding grounding lines of the grounding electrode pads (2c) on both sides thereof are positioned to be placed in contact with a probing needle of a well-known high frequency wafer probe during a high frequency characteristic test.

8 Claims, 3 Drawing Sheets

METHOD OF MAKING A SEMICONDUCTOR DEVICE OPERATING IN HIGH FREQUENCY RANGE

This application is a division of Application Ser. No. 07/426,926, still pending filed Oct. 26, 1989 which is a division of Application Ser. No. 07/081,709, U.S. Pat. No. 4,926,234 filed Aug. 3, 1987.

BACKGROUND OF THE INVENTION

1. Field of the Invention

The present invention relates to a semiconductor device and, more particularly, it relates to a semiconductor device operating in a high frequency range exceeding several tens MHz.

2. Description of the Prior Art

A semiconductor device operating in a high frequency range is divided into a plurality of IC chips from a wafer after manufacturing, to be subjected to a high frequency characteristic test. Description is provided of a conventional method of measuring such high frequency characteristic with reference to FIGS. 1—3.

FIG. 1 is a plan view showing an example of a conventional high frequency IC chip, and FIG. 2 is a sectional view taken along the line 2—2 in FIG. 1.

An input electrode pad $2a$ and an output electrode pad $2b$ are formed on an IC chip 1 including circuits of various functions, to be in conduction with the respective circuits. A grounding metal member 4 is formed on the rear surface of the IC chip 1, to be in conduction with the front surface of the IC chip 1 through a viahole 3. As shown in FIG. 2, the input electrode pad $2a$ and output electrode pad $2b$ (not shown) are formed by microstriplines.

FIG. 3 is a plan view showing the device of FIG. 1 in a state of measuring the high frequency characteristic of the IC chip 1 thus formed.

In general, a plurality of such IC chips 1 are independently received in a chip carrier 6 to be in conduction with the exterior through a jig 5, which is adapted to measure the high frequency characteristic of the IC chips 1. Several hours are required to prepare for such measurement since the plurality of IC chips 1 are respectively obtained from the wafer and the chip carrier 6 is prepared in response to the chip size for receiving the IC chips 1, to be set in the measuring jig 5. Further, accuracy in measurement is reduced through parasitic capacitance of the jig 5 itself and resonance by the jig 5.

On the other hand, there has been developed a high frequency wafer probe, which can measure the high frequency characteristic through contact with a single surface of the measured object.

Such a probe is disclosed in "Precise MMIC Parameters Yielded by 18~GHz Wafer Probe", by K. R. Greason et al., Microwave System News, issued on May 1983, with reference to a basic method of microwave on-wafer probing.

Such a probe is also disclosed in "Microwave Wafer Probing Achieves On-Wafer Measurements Through 18 GHz", by D. E. Carlton et al., Microwave System News, issued on May, 1985, with reference to a calibration method in microwave on-wafer probing (particularly loss correction, crosstalk correction, etc., in a two-port device).

However, it is difficult to achieve on-wafer measurement of a semiconductor device through such a probe. Since the surface of an IC chip provided with input and output electrode pads is entirely covered by a nitride film except for the parts of the input and output electrode pads, grounding lines must be extracted from a grounding metal member provided on the rear surface of the IC chip. However, measurement through the probe is performed by placing the IC chip on a stage, and hence it is difficult to bring the needle of the probe into contact with the rear surface of the IC chip.

SUMMARY OF THE INVENTION

The principal object of the present invention is to provide a semiconductor device whose high frequency characteristic can be measured in a short time with high accuracy.

In order to achieve the above object, the semiconductor device according to the present invention comprises an IC chip provided on a surface with an input electrode pad and an output electrode pad and grounding electrode pads formed on said surface of the IC chip to sandwich the input and output electrode pads at regular intervals.

The semiconductor device of such structure facilitates measurement of the high frequency characteristic on a single surface thereof through the aforementioned high frequency wafer probe.

Further to the above description, an important first feature of the present invention is that the grounding electrode pads are provided on the surface of the IC chip, and the second feature is that the grounding electrode pads are provided in positions separable by cutting, and a third feature is that the distance between the input electrode pad and the grounding electrode pads is constant and equal to that between the output electrode pad and the grounding electrode pads.

By virtue of such constant and equal spaces provided between the pads, the same probe can be employed for various types of IC chips regardless of difference in size.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 4:
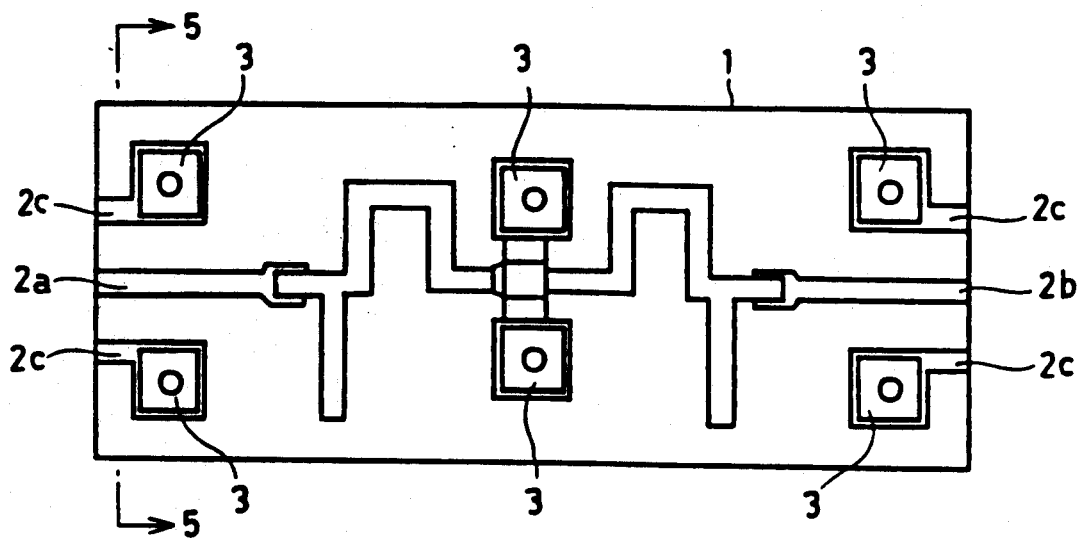
FIG. 4 is a plan view of a high frequency IC chip according to an embodiment of the present invention, which is formed on its surface with grounding electrode pads on both sides of the input and output electrode pads respectively.
Figure 5:
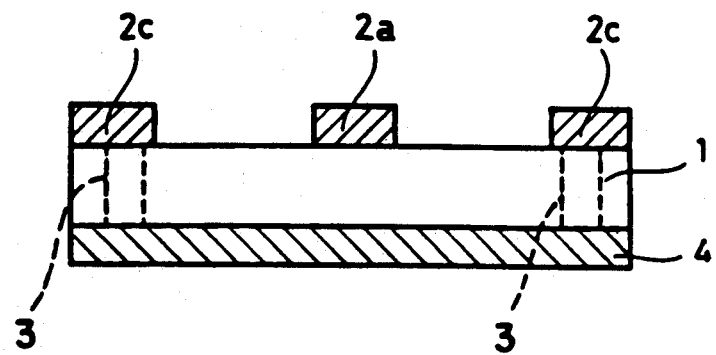
FIG. 5 is a sectional view taken along the line 5—5 in FIG. 4.

FIG. 4 is a plan view showing a semiconductor device according to an embodiment of the present invention, and FIG. 5 is a sectional view taken along the line 5—5 in FIG. 4.

With reference to FIGS. 4 and 5, description is now provided of the structure of the semiconductor device according to the present invention.

An IC chip 1 serving as a semiconductor substrate assembled with circuits having various functions is provided at a surface thereof with an input electrode pad 2a and an output electrode pad 2b, which are in conduction with the respective circuits. Pairs of grounding electrode pads 2c are formed on both sides of the input electrode pad 2a and output electrode pad 2b respectively, to be connected with a grounding metal member 4 provided on the rear surface of the IC chip 1 through an opening passing through the IC chip 1, i.e., a viahole 3. Thus, the IC chip 1 of the present invention is implemented by a conventional IC chip, which has grounding electrode pads provided on both sides of input and output electrode pads respectively to sandwich the same.

Figure 6:
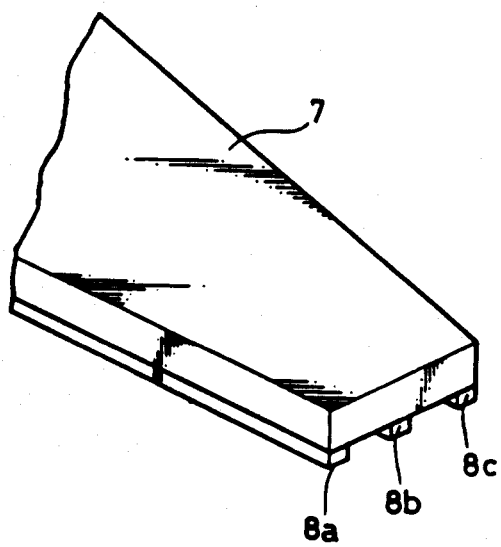
FIG. 6 is a partially fragmented perspective view showing a high frequency wafer probe employed in the embodiment of the present invention, which probe is in coplanar line structure provided with grounding lines and a signal line on its lower surface.
Figure 7:
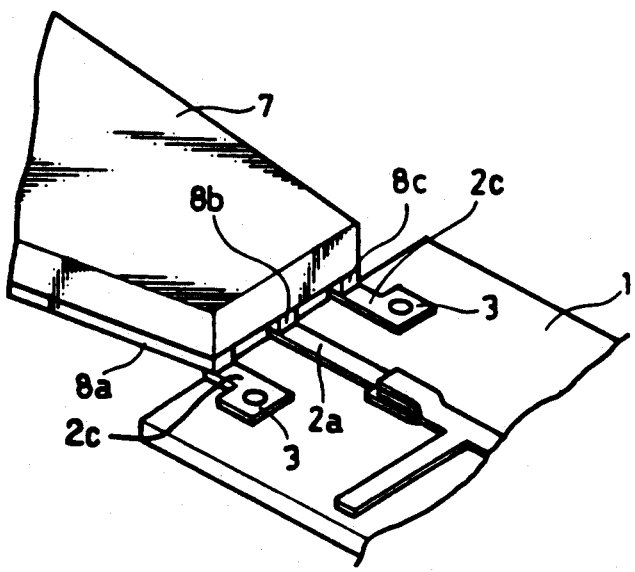
FIG. 7 is a partially fragmented perspective view showing a preferred embodiment of this invention in a state of measuring the high frequency characteristic of the IC chip, in which the grounding lines and the signal line of the probe are in contact with the grounding electrode pads and the input electrode pad of the IC chip.

FIG. 6 is a partially fragmented perspective view showing the forward end portion of a probing needle of a well-known high frequency wafer probe, and FIG. 7 is a partially fragmented perspective view showing a state of measuring the high frequency characteristic of the IC chip according to the present invention by the probe.

Referring to FIGS. 6 and 7, the forward end portion of the probing needle of the probe is in coplanar line structure, which is formed by a ceramic body 7 provided on its bottom surface with grounding lines 8a and 8c and a signal line 8b. In general, the distance between the grounding line 8a and the signal line 8b is constant and equal to that between the grounding line 8c and the signal line 8b. Therefore, even if IC chips 1 are varied in size, measurement of the high frequency characteristic can be easily achieved by conforming a positional relationship between the input electrode pad 2a and output electrode pad 2b and the grounding electrode pads 2c on each IC chip 1 to the positional relationship between the respective lines on the probe to be employed. It may be obvious for those skilled in the art to form the respective pads on prescribed positions of the IC chip 1.

Thus, high frequency wafer probing can be extremely quickly performed by simply bringing the forward end portion of the probing needle into close contact with the input and output parts of the IC chip 1 as indicated in FIG. 7. Since the grounding electrode pads 2c are provided on the surface of the IC chip 1, the probe can be effected on a single surface of the IC chip 1, which is not yet divided but is still in a wafer state placed on a stage.

Figure 1:
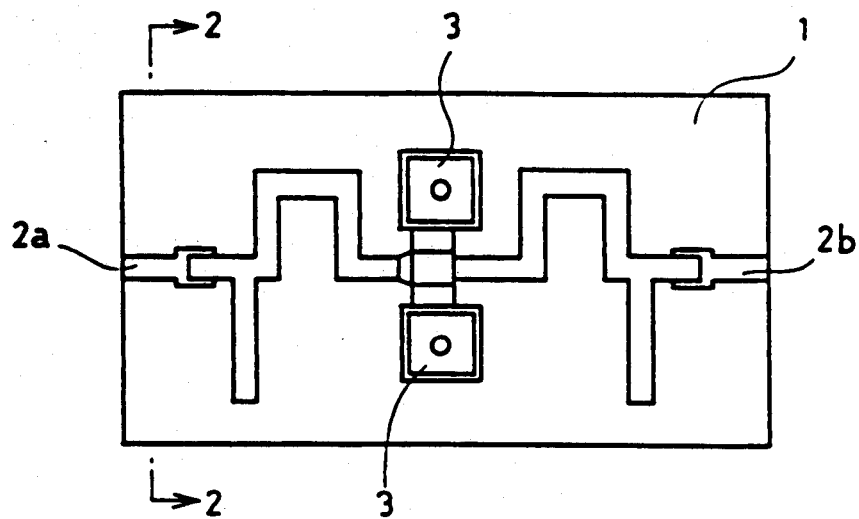
FIG. 1 is a plan view showing an example of a conventional high frequency IC chip, which is provided with an input electrode pad and an output electrode pad on its surface.
Figure 2:
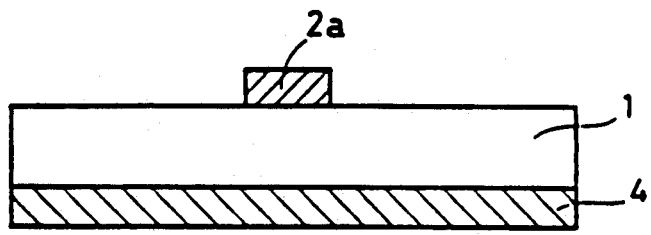
FIG. 2 is sectional view taken along the line 2—2 in FIG. 1.
Figure 3:
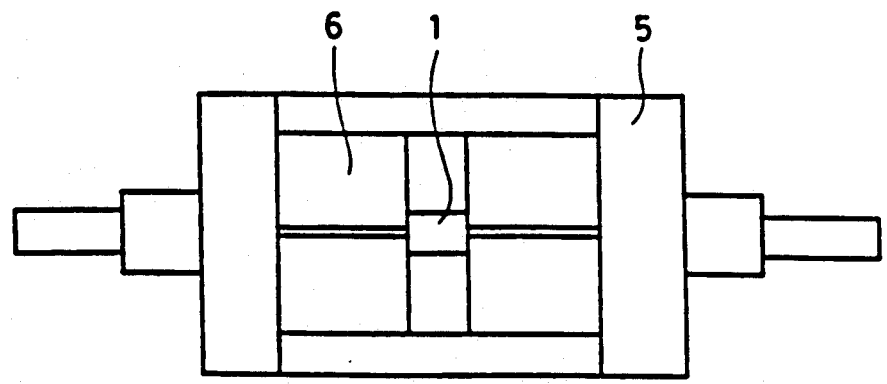
FIG. 3 is a plan view showing the device of FIG. 1 in a state of measuring the high frequency characteristic of a conventional IC chip, which is received in a chip carrier to be set in a measuring jig.

As a result, the time required for measuring the high frequency characteristic of the semiconductor device according to the present invention will be reduced to about 1/100 as compared with the conventional case. Further, accuracy in measurement of the high frequency characteristic of the semiconductor device according to the present invention will be improved by about 10 times as compared with the conventional case. The semiconductor device according to the present invention requires no measuring jig 5 as employed in the conventional case (see FIG. 3), whereby no influence by the parasitic capacitance of such a jig or resonance by such a jig is exerted on any measurements.

Figure 8:
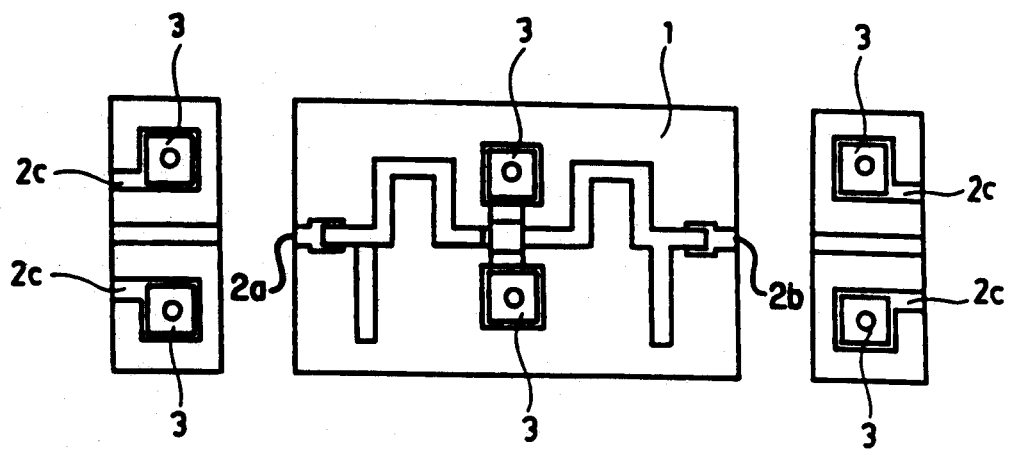
FIG. 8 is a plan view showing the device in a state following of cutting off of unnecessary parts of the IC chip according to the present invention after measurement of the high frequency characteristic, in which the input and output electrode pads are partially cut with the grounding electrode pads to be separated from the IC chip.

FIG. 8 shows a state of the IC chip 1 following cutting of the pad parts employed in measurement of the high frequency characteristic to leave only a required part of the IC chip 1 separated from the wafer after the measurement. As a matter of course, it is also possible to use the IC chip 1 in the state as shown in FIG. 4 without separating the pad parts employed for the measurement.

Although the grounding electrode pads 2c are adapted to sandwich the input electrode pad 2a and output electrode pad 2b in the aforementioned embodiment, such grounding electrode pads may be provided in a different manner so long as the positional relationship of the same can conform to that of the respective lines on the forward end portion of the probing needle in the probe employed for measurement of the high frequency characteristic.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device operating in a high frequency range, said method comprising:
   a step of preparing a semiconductor substrate (1) having a major surface and including integrated circuits;
   a step of forming an input electrode pad (2a) on said major surface of said semiconductor substrate (1) to be connected with said integrated circuits;
   a step of forming an output electrode pad (2b) on said major surface of said semiconductor substrate (1) to be connected with said integrated circuits;
   a step of forming grounding electrode pads (2c) on said major surface of said semiconductor substrate (1) for grounding said semiconductor substrate (1) in a high frequency characteristic test; and
   a step of removing parts of said semiconductor substrate (1) including parts of said input electrode pad (2a) and said output electrode pad (2b) and said grounding electrode pads (2c) after said high frequency characteristic test.

2. A method of manufacturing a semiconductor device operating in a high frequency range in accordance with claim 1, wherein
   said grounding electrode pads (2c) forming step includes a step of sandwiching said input electrode pad (2a) with a first constant distance between a pair of said grounding electrode pads (2c) and said input electrode pad (2a) and said output electrode pad (2b) with a second constant distance between a pair of said grounding electrode pads (2c) and said output electrode pad (2b) respectively.

3. A method of manufacturing a semiconductor device operating in a high frequency range in accordance with claim 2, wherein
said input electrode pad (2a) and said output electrode pad (2b) are respectively aligned with said grounding electrode pads (2c).

4. A method of manufacturing a semiconductor device operating in a high frequency range in accordance with claim 3, wherein
said first constant distance is equal to said second constant distance.

5. A method of manufacturing a semiconductor device operating in a high frequency range, said method comprising:
- a step of preparing a semiconductor substrate (1) having a first major surface and a second major surface and including integrated circuits;
- a step of forming openings (3) passing through said first major surface and said second major surface in said semiconductor substrate (1);
- a step of forming an input electrode pad (2a) on said first major surface of said semiconductor substrate (1) to be connected with said integrated circuits;
- a step of forming an output electrode pad (2b) on said first major surface of said semiconductor substrate (1) to be connected with said integrated circuits;
- a step of forming grounding electrode pads (2c) on said first major surface of said semiconductor substrate (1) for grounding said semiconductor substrate (1) in a high frequency characteristic test;
- a step of forming a grounding metal member (4) on said second major surface of said semiconductor substrate (1) to be in conduction with said grounding electrode pads (2c);
- a step of bringing said grounding electrode pads (2c) into conduction with said grounding metal member (4) through said openings (3); and
- a step of removing parts of said semiconductor substrate (1) including parts of said input electrode pad (2a) and said output electrode pad (2b), parts of said grounding metal member (4) and said grounding electrode pads (2c).

6. A method of manufacturing a semiconductor device operating in a high frequency range in accordance with claim 5, wherein
said grounding electrode pads (2c) forming step includes a step of sandwiching said input electrode pad (2a) with a first constant distance between a pair of said grounding electrode pads (2c) and said input electrode pad (2a) and said output electrode pad (2b) with a second constant distance between a pair of said grounding electrode pads (2c) and said input electrode pad (2a) respectively.

7. A method of manufacturing a semiconductor device operating in a high frequency range in accordance with claim 6, wherein
said input electrode pad (2a) and said output electrode pad (2b) are respectively aligned with said grounding electrode pads (2c).

8. A method of manufacturing a semiconductor device operating in a high frequency range in accordance with claim 7, wherein
said first distance is equal to said second distance.

* * * * *